United States Patent
Lai et al.

(10) Patent No.: US 6,323,066 B2
(45) Date of Patent: Nov. 27, 2001

(54) HEAT-DISSIPATING STRUCTURE FOR INTEGRATED CIRCUIT PACKAGE

(75) Inventors: Jeng Yuan Lai, Taichung; Chien Ping Huang, Hsintsu Hsien, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/798,397

(22) Filed: Mar. 2, 2001

Related U.S. Application Data

(62) Division of application No. 09/470,066, filed on Dec. 22, 1999, now Pat. No. 6,236,568.

(30) Foreign Application Priority Data

Mar. 20, 1999 (TW) ................................................ 88104406

(51) Int. Cl.⁷ .................................................. H01L 21/44
(52) U.S. Cl. ........................... 438/122; 438/124; 438/127
(58) Field of Search ..................................... 438/122, 123, 438/124, 125, 126, 127, 111, 112

(56) References Cited

U.S. PATENT DOCUMENTS

| | | | |
|---|---|---|---|
| 5,650,662 | * 7/1997 | Edwards et al. | 257/700 |
| 5,734,555 | * 3/1998 | McMahon | 257/713 |
| 5,736,785 | 4/1998 | Chiang et al. | |
| 5,821,161 | * 10/1998 | Covell, II et al. | 438/613 |
| 5,856,911 | * 1/1999 | Riley | 257/713 |
| 5,926,371 | * 7/1999 | Dolbear | 257/713 |
| 5,931,222 | * 8/1999 | Toy et al. | 257/722 |
| 5,956,576 | * 9/1999 | Toy et al. | 438/125 |
| 6,008,988 | * 12/1999 | Palmer | 257/713 |
| 6,091,603 | * 7/2000 | Daves et al. | 361/704 |

* cited by examiner

Primary Examiner—Kevin M. Picardat
(74) Attorney, Agent, or Firm—Peter F. Corless; Edwards & Angell, LLP

(57) ABSTRACT

A heat-dissipating structure is designed for use on an integrated circuit (IC) package, such as a BGA (Ball Grid Array) integrated circuit package, for heat dissipation from the integrated circuit package during operation. The heat-dissipating structure includes a heat-conductive piece having a first side and a second side, with the first side being exposed to the outside of the integrated circuit package; a buffer pad made of a heat-conductive material having an equivalent CTE as the integrated circuit chip enclosed in the integrated circuit package, the buffer pad having a first side and a second side, with the first side being attached to the second side of the heat-conductive piece; and a flexible adhesive layer having a first side attached to the second side of the buffer pad and a second side attached to the integrated circuit chip. The heat-dissipating structure allows the integrated circuit chip to be prevented from being damaged by the thermal compressive stress from the encapsulant and the tensile stress from the silver paste for adhering the integrated circuit chip to a substrate on which the integrated circuit chip is mounted, thus allowing the integrated circuit package to be made more reliable with good yield rate.

11 Claims, 2 Drawing Sheets

HEAT-DISSIPATING STRUCTURE FOR INTEGRATED CIRCUIT PACKAGE

This application is a divisional of application Ser. No. 09/470,066, filed Dec. 22, 1999, now U.S. Pat. No. 6,236,568.

BACKGROUND OF THE INVENTION

1. Field of the Invention

This invention relates to integrated circuit (IC) packages, and more particularly, to a heat-dissipating structure for use in an integrated circuit package, such as a BGA (Ball Grid Array) integrated circuit package, for heat dissipation from the integrated circuit package during operation.

2. Description of Related Art

BGA integrated circuit packages allow the integrated circuit package to have a low profile while nevertheless incorporating a large packing density of electronic components with a high package pin count. During the operation of the integrated circuit chip, a large amount of heat can be generated due to the flowing of electricity through the electronic components on the integrated circuit chip. If this heat is not dissipated, it can cause damage to the internal circuitry of the integrated circuit chip. Therefore, it is required to provide heat-dissipating means on the integrated circuit package for heat dissipation during operation.

Types of BGA integrated circuit packages include PBGA (Plastic BGA), CBGA (Ceramic BGA), and TBGA (Tape BGA), which are so named in terms of the material being used to form the substrate. Among them PBGA integrated circuit packages, however, are poor in heat-dissipating efficiency since plastics are poor in heat conductivity. To allow PBGA integrated circuit packages to have a high heat-dissipating efficiency, a conventional solution is to provide a heat sink or a heat slug.

The U.S. Pat. No. 5,736,785 to Chiang et al. discloses a BGA integrated circuit package that is provided with a heat sink. FIG. 5 shows the structure of this BGA integrated circuit package. As shown, the patent utilizes a heat sink 116 which is mounted on a substrate 104 on which an integrated circuit chip 102 is mounted. The heat sink 116 is formed with a circular downwardly-protruded portion 116a in the center thereof, which is abutted on the top side of the integrated circuit chip 102, allowing the heat produced from the integrated circuit chip 102 to be dissipated by the heat sink 116 to the atmosphere. Further, the heat sink 116 is formed with another four downwardly-protruded portions 116c which are dimensioned with a larger depth than the protruded portion 116a so that the entire body of the heat sink 116 can be supported on the substrate 104. The heat sink 116 is further formed with an upwardly-protruded portion 116d which is exposed to the outside of the integrated circuit package so that the heat can be dissipated to the atmosphere.

The use of the foregoing heat sink 116 for heat dissipation, however, has the following drawbacks. First, since the integrated circuit chip 102 is very fragile and small in size, the abutting of the heat sink 116 on the integrated circuit chip 102 would easily cause the integrated circuit chip 102 to crack during the cooling process of the encapsulate 112, or during the cooling process of the integrated circuit package after solder reflow, or during the temperature-cycle reliability test. This is because that the copper-made heat sink 116 has a significantly greater coefficient of thermal expansion (CTE) than the integrated circuit chip 102 (copper has a CTE of 18 ppm/°C., while integrated circuit chip has a CTE of 3 ppm/°C.); and therefore, during a cooling process, the heat sink 116 would cause a thermal compressive stress to the integrated circuit chip 102, thus causing the integrated circuit chip 102 to be cracked.

Second, since the resin-made encapsulant 112 has a large CTE of about 20 ppm/°C. and encloses a large part of the active surface of the integrated circuit package (the term "active surface" refers to the surface part of the integrated circuit chip where electronic components are formed), it would also easily cause the integrated circuit chip 102 to be cracked or delaminated from the encapsulant 112 during the cooling process of the integrated circuit package.

Third, during molding process, the existence of the downwardly-protruded portion 116a, 116c would cause disturbance to the resin flow, thus causing undesired forming of voids in the resulted encapsulant 112. The forming of these voids would easily cause a popcorn effect during the solder-reflow process, which might result in damage to the integrated circuit package.

Fourth, the heat sink 116 is still considered unsatisfactorily low in heat-dissipating efficiency due to the fact that the upwardly-protruded portion 116d is relatively small in extent compared to the overall size of the heat sink 116; and therefore, the majority of the heat would dissipate through the following path: chip→encapsulant→heat sink→encapsulant→atmosphere. Since the resin-made encapsulant 112 has a heat conductivity of just 0.8 w/m° K., the heat dissipation through this path would be undoubtedly low in efficiency.

One solution to the foregoing problems is shown in FIG. 6. This solution is characterized in the provision of an improved heat sink 116' which is unabutted on the integrated circuit chip 102'. This feature can prevent the resin flow during the molding process to be subjected to disturbance as well as prevent the heat sink 116' from causing a thermal compressive stress on the integrated circuit chip 102' during the cooling process. In addition, the heat sink 116' is formed with a large exposed area to the atmosphere, which can help increase the heat-dissipating efficiency.

One drawback to the forgoing solution, however, is that, since the integrated circuit chip 102' is entirely encapsulated in the encapsulant 112', the cooling process would nevertheless cause the encapsulant 112' to bring a thermal compressive stress to the integrated circuit chip 102' during the cooling process. Moreover, the heat sink 116' is still considered unsatisfactorily low in heat-dissipating efficiency, since most of the heat from the integrated circuit chip 102' is transferred to the heat sink 116' via the encapsulant 112' and the encapsulant 112' is quite low in heat conductivity. Still moreover, the integrated circuit package shown in FIG. 6 is incapable of providing a strong mechanical strength to the integrated circuit chip 102', making the integrated circuit chip 102' vulnerable against the thermal compressive stress from the resin-made encapsulant 112 and the tensile stress from the silver-paste layer.

Furthermore, the above-mentioned two BGA integrated circuit packages respectively shown in FIGS. 5 and 6 would provide a penetrating passage to allow atmospheric moisture to penetrate through the encapsulant to the integrated circuit chips enclosed therein, which may cause the integrated circuit chips to function improperly during operation.

SUMMARY OF THE INVENTION

It is therefore an objective of this invention to provide a heat-dissipating structure for integrated circuit package, which can help prevent the encapsulant to cause a large thermal compressive stress on the integrated circuit chip during the cooling process.

It is another objective of this invention to provide a heat-dissipating structure for integrated circuit package, which can offer a larger heat-dissipating efficiency than the prior art.

It is still another objective of this invention to provide a heat-dissipating structure for integrated circuit package, which can help increase the mechanical strength of the integrated circuit chip, so that the integrated circuit chip can be prevented from being subjected to thermal compressive stress and tensile stress resulted from the encapsulant during packaging process.

It is yet another objective of this invention to provide a heat-dissipating structure for integrated circuit package, which has a larger exposed area to the atmosphere than the prior art so that the heat-dissipating efficiency can be increased as compared to the prior art.

It is still yet another objective of this invention to provide a heat-dissipating structure for integrated circuit package, which can help prevent the atmospheric moisture from penetrating to integrated circuit chip enclosed in the integrated circuit package.

In accordance with the foregoing and other objectives of this invention, a new heat-dissipating structure for integrated circuit package is provided. The heat-dissipating structure of the invention includes: (a) a heat-conductive piece having a first side and a second side, with the first side being exposed to the outside of the integrated circuit package; (b) a buffer pad made of a heat-conductive material having an equivalent CTE as the integrated circuit chip enclosed in the integrated circuit package, the buffer pad having a first side and a second side, with the first side being attached to the second side of the heat-conductive piece; and (c) a flexible adhesive layer having a first side attached to the second side of the buffer pad and a second side attached to the integrated circuit chip.

It is a characteristic feature of the invention that the buffer pad is made of a heat-conductive material having a nearly-equal CTE as the integrated circuit chip enclosed in the integrated circuit package, such as semiconductor material, ceramics, or dielectrics. This feature allows the integrated circuit chip to be prevented from cracking due to a thermal compressive stress from the buffer pad that would otherwise occur during a cooling process performed in subsequence to a thermal process. Preferably, the buffer pad is a defective integrated circuit chip or a rejected integrated circuit chip. This allows all the defective and rejected integrated circuit chips in the reliability test to be nevertheless useful to serve as the buffer pad in the heat-dissipating structure of the invention.

The flexible adhesive layer is made of an electrically-insulative but heat-conductive material, such as epoxy resin. To increase its heat conductivity, the epoxy resin can be mixed with ceramic powder. The total height of the heat-dissipating structure should be dimensioned in such a manner as to allow the first side of the heat-conductive piece to abut tightly against the top wall of the cavity of an encapsulating mold for encapsulating the integrated circuit chip and, to allow the heat-conductive piece and the buffer pad to be tightly abutted on each other, without the forming of any voids therebetween. This feature can prevent the resin flow used in the molding process from flashing over the exposed area of the heat-conductive piece which could affect the overall heat-dissipating efficiency of the heat-dissipating structure, since the encapsulation material is typically poor in heat conductivity. The height of the heat-dissipating structure is preferably slightly greater than the depth of the cavity of the encapsulating mold, so that during molding process, a downward pressing force can be applied to the heat-conductive piece, causing the flexible adhesive layer to be compressed, so that the interface between the heat-conductive piece and the buffer pad can be made more air-tightly.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

First Preferred Embodiment

Figure 1:
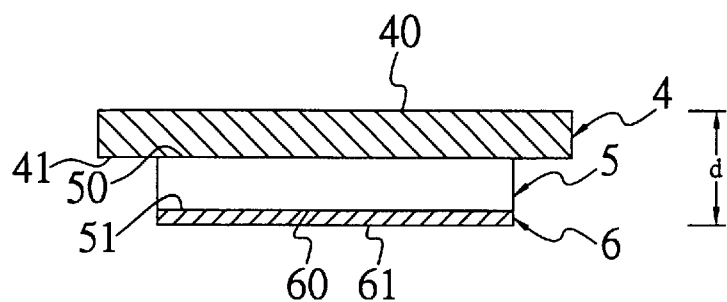
FIG. 1 is a schematic sectional diagram of a first preferred embodiment of the heat-dissipating structure according to the invention.
Figure 2:
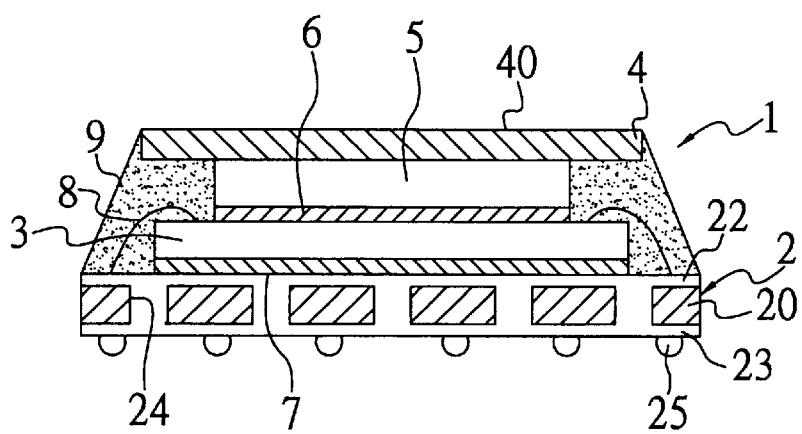
FIG. 2 is a schematic sectional diagram showing the mounting of the heat-dissipating structure of FIG. 1 on a BGA integrated circuit package.

A first preferred embodiment of the heat-dissipating structure according to the invention is disclosed in the following with reference to FIGS. 1 and 2; wherein FIG. 1 shows a schematic sectional view of the first preferred embodiment of the invention; and FIG. 2 shows the mounting of the heat-dissipating structure of FIG. 1 in an integrated circuit package.

As shown in FIG. 1, the heat-dissipating structure of this embodiment includes a heat-conductive piece 4, a buffer pad 5, and a flexible adhesive layer 6. The heat-conductive piece 4 is a flat piece of a heat-conductive material such as copper, a copper alloy, aluminum, or an aluminum alloy, and having a first side 40 and a second side 41. The buffer pad 5 has a first side 50 and a second side 51, with the first side 50 being attached to the second side 41 of the heat-conductive piece 4 and the second side 51 being attached to the flexible adhesive layer 6. It is a characteristic feature of the invention that the buffer pad 5 is made of a heat-conductive material having a greater heat conductivity than the encapsulating resin and an equivalent CTE as the integrated circuit chip enclosed in the associated integrated circuit package, such as a semiconductor material, ceramics, or dielectrics. Preferably, the buffer pad 5 can be a defective integrated circuit chip or a rejected integrated circuit chip. This allows all the defective and rejected integrated circuit chips to be nevertheless useful to serve as the buffer pad 5 in the heat-dissipating structure of the invention, allowing the overall integrated circuit manufacture to be more cost-effective. In the case of the buffer pad 5 being a defective or rejected integrated circuit chip, if the heat-dissipating structure of the invention is mounted on the active surface of an integrated circuit chip (referred to as the functioning integrated circuit chip), the defective or rejected integrated circuit chip should be smaller in size than the functioning integrated circuit chip to such an extent that allows the defective or rejected integrated circuit chip not to come into electrical contact with the bonding pads on the functioning integrated circuit chip. On the other hand, if the functioning integrated circuit chip is mounted on a substrate in a flip-chip manner, since the defective or rejected integrated circuit chip is mounted on the back side of the functioning integrated circuit chip, the defective or rejected integrated circuit chip is unrestricted in size.

The flexible adhesive layer 6 is made of an electrically-nonconductive but heat-conductive material, such as epoxy resin. To increase its heat conductivity, the epoxy resin can be mixed with ceramic powder. The flexible adhesive layer 6 has a first side 60 attached to the second side 51 of the buffer pad 5 and a second side 61 to be attached to the top surface of an integrated circuit chip where heat dissipation is desired. Details about the mounting of the heat-dissipating structure of the invention in an integrated circuit package is depicted in the following with reference to FIG. 2.

FIG. 2 shows the mounting of the heat-dissipating structure of FIG. 1 in a BGA integrated circuit package 1. As shown, the BGA integrated circuit package 1 comprises a substrate 2 having a core layer 20. The substrate 2 can be either a two-layer structure or a single-layer structure. In the case of a two-layer structure (which is the case shown in FIG. 2), two conductive trace structures are formed on the opposite sides of the core layer 20, including a first conductive trace layer 22 on the top side of the core layer 20 and a second conductive trace layer 23 on the bottom side of the core layer 20. In the case of a single-layer structure (which is the so-called Tape BGA package), only the top side of the core layer is provided with a conductive trace layer. The core layer 20 can be formed from epoxy resins, polyimide resins, triazine resins, ceramics, or dielectrics, and more specifically, a bismaleimidetriazine(BT) resin is preferred. The first and second conductive trace layers 22, 23 are both made of copper, for example. The first conductive trace layer 22 is electrically connected by vias 24 formed in the core layer 20 to the second electrical-trace structure 23. Further, a plurality of solder balls 25 are bonded to the terminals of the second conductive trace layer 23.

An integrated circuit chip 3 is securely mounted on the substrate 2 by means of a silver-paste 7. Further, the integrated circuit chip 3 is electrically connected to the first conductive trace layer 22 via a plurality of gold wires 8, which allows the integrated circuit chip 3 to be electrically connected to the solder balls 25 so that it can be functionally connected to external device such as a printed circuit board (not shown). Alternatively, the integrated circuit chip 3 can be mounted on the substrate 2 through the conventional TAB (Tape Automated Bonding) method or the conventional flip-chip method.

The method of mounting the heat-dissipating structure of the invention on the BGA integrated circuit package 1 includes a first step of adhering the flexible adhesive layer 6 on the integrated circuit chip 3; a second step of mounting the buffer pad 5 on the flexible adhesive layer 6; and a third step of mounting the heat-conductive piece 4 on the buffer pad 5. The total height of the heat-dissipating structure, as denoted by d in FIG. 1, should be dimensioned in such a manner as to allow the first side 40 of the heat-conductive piece 4 to abut tightly against the top wall of a cavity in an encapsulating mold (not shown), and also allow the heat-conductive piece 4 and the buffer pad 5 to be tightly abutted on each other, without the forming of any voids therebetween. This feature can prevent the resin flow used in the molding process from being flashed over the first side 40 of the heat-conductive piece 4. The outer appearance of the overall integrated circuit package can thus be made into good shape. The height d of the heat-dissipating structure is preferably slightly greater than the depth of the cavity of the encapsulating mold, so that during the molding process, a downward pressing force can be applied to the heat-conductive piece 4, causing the flexible adhesive layer 6 to be compressed, so that the interface between the heat-conductive piece 4 and the buffer pad 5 can be made more air-tightly.

After the molding process is completed, the resulted encapsulant 9 encloses the integrated circuit chip 3, the buffer pad 5, and part of the heat-conductive piece 4, with the first side 40 of the heat-conductive piece 4 being exposed to the outside. The heat produced from the integrated circuit chip 3 during operation can be dissipated through the following path: integrated circuit chip 3→flexible adhesive layer 6→buffer pad 5→heat-conductive piece 4→atmosphere. In the case of the buffer pad 5 being a defective or rejected integrated circuit chip, its heat conductivity is about 130 W/m° K., which is significantly greater than that of the resin-made encapsulant 9 (0.8 W/m° K.). The heat-dissipating structure of the invention can therefore provide a higher heat-dissipating efficiency than the prior art. Moreover, since the exposed part of the heat-conductive piece 4, i.e., the first side 40 of the heat-conductive piece 4, is greater in the exposed area to the atmosphere than the prior art, the heat-dissipating efficiency is increased. Further, since the buffer pad 5 is a defective or rejected integrated circuit chip, its CTE is substantially the same as the functioning integrated circuit chip 3, and therefore, the integrated circuit chip 3 can be prevented from cracking due to a thermal compressive stress from the buffer pad 5 that would otherwise occur during a cooling process as in the case of the prior art. the flexible adhesive layer 6 can further provide a cushion effect to the integrated circuit chip 3, so that the integrated circuit chip 3 can be prevented from being damaged by the thermal compressive stress from the encapsulant 9 and the tensile stress from the silver-paste 7. This can help the BGA integrated circuit package 1 to be made more reliable.

After the encapsulating process is completed, a solder ball-implantation process is performed to implant a plurality of solder balls 25 to the terminals of the second conductive trace layer 23. This completes the manufacture of the BGA integrated circuit package incorporating the heat-dissipating structure of the invention.

Second Preferred Embodiment

Figure 3:
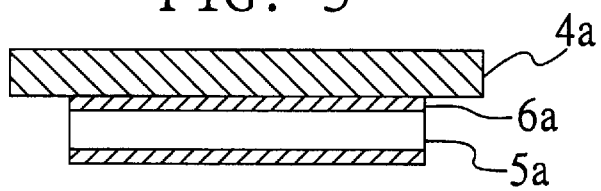
FIG. 3 is a schematic sectional diagram of a second preferred embodiment of the heat-dissipating structure according to the invention.

FIG. 3 is a schematic sectional diagram of the second preferred embodiment of the heat-dissipating structure according to the invention.

As shown, this embodiment differs from the previous one only in that an additional flexible adhesive layer, as here designated by the reference numeral 6a, is provided between the heat-conductive piece 4a and the buffer pad 5a. This provision can further help the integrated circuit chip to resist against the thermal compressive stress from the encapsulant 9 and the tensile stress from the silver paste.

Third Preferred Embodiment

Figure 4:
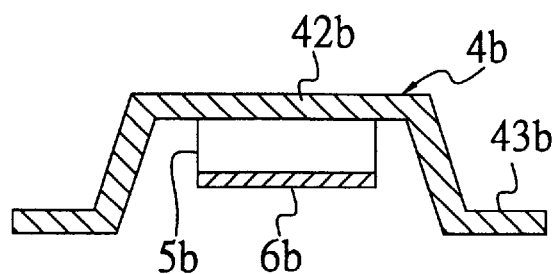
FIG. 4 is a schematic sectional diagram of a third preferred embodiment of the heat-dissipating structure according to the invention.
Figure 5:
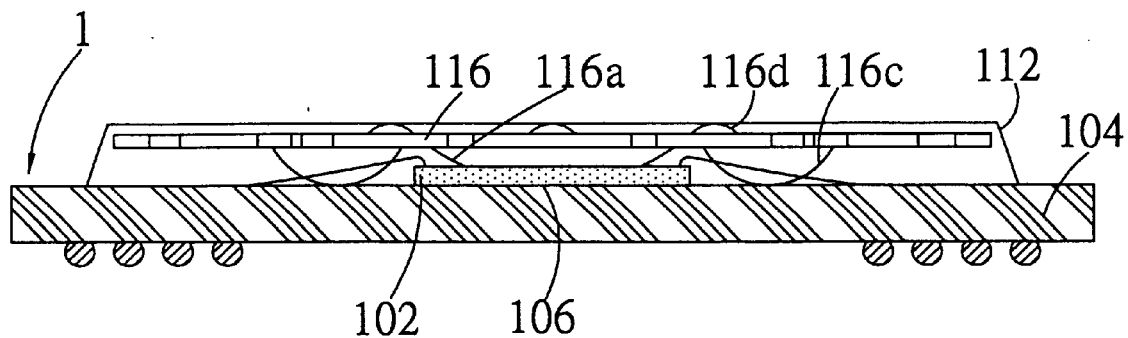
FIG. 5 (PRIOR ART) is a schematic sectional diagram of a conventional type of BGA integrated circuit package.
Figure 6:
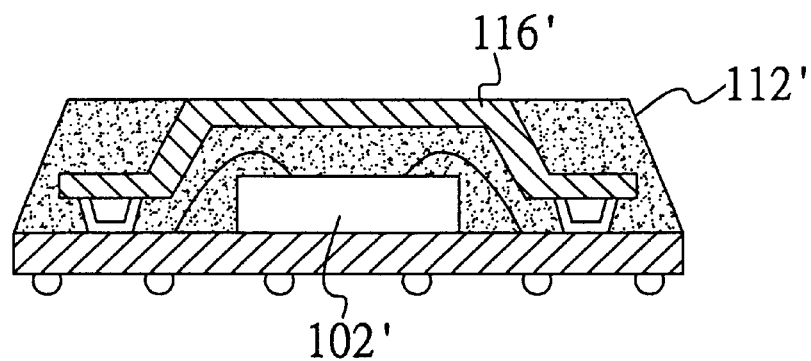
FIG. 6 (PRIOR ART) is a schematic sectional diagram of another conventional type of BGA integrated circuit package.

FIG. 4 is a schematic sectional diagram of the third preferred embodiment of the heat-dissipating structure according to the invention.

As shown, this embodiment differs from the first one only in that the heatconductive piece, here designated by the reference numeral 4b, is formed in such a manner as to include a flat portion 42b and a pair of leg portions 43b downwardly bending from the edges of the flat portion 42b. The flat portion 42b is attached on the buffer pad 5b mounted on the flexible adhesive layer 6b, while the leg portions 43b are dimensioned in such a manner as extending beyond the flexible adhesive layer 6b by a distance substantially equal to the height of the integrated circuit chip on which the heat-dissipating structure is to be mounted. This leg portions 43b are mounted on the substrate 2 so as to support the entire heat-dissipating structure on the integrated circuit chip.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of manufacturing an integrated circuit package having a heat-dissipating structure, comprising the steps of:

preparing a substrate;

mounting an integrated circuit chip on the substrate;

electrically interconnecting the integrated circuit chip and the substrate;

adhere a flexible adhesive layer on the integrated circuit chip;

mounting a buffer pad on the flexible adhesive layer, the buffer pad being made of a heat-conductive material having an equivalent CTE as the integrated circuit chip;

mounting a heat-conductive piece over the buffer pad;

performing a molding process to form an encapsulant which encapsulates the entire integrated circuit chip, the entire buffer pad, and part of the heat-conductive piece therein, with one side of the heat-conductive piece being exposed to the outside of the encapsulant; and providing external electrical connecting means to the exposed side of the substrate.

2. The method of claim 1, wherein the integrated circuit chip is electrically connected to the substrate through wire bonding.

3. The method of claim 1, wherein the integrated circuit chip is electrically connected to the substrate through flip-chip bonding.

4. The method of claim 1, wherein the buffer pad is made of a material selected from the group consisting of ceramics, dielectrics and semiconductor material.

5. The method of claim 1, wherein the buffer pad is a non-finctioning integrated circuit chip.

6. A method of manufacturing an integrated circuit package having a heat-dissipating structure, comprising the steps of:

preparing a substrate;

mounting an integrated circuit chip on the substrate;

electrically interconnecting the integrated circuit chip and the substrate;

mounting a heat-dissipating structure on the integrated circuit chip, the heat-dissipating structure including:

a heat-conductive piece having a first side and a second side, with the first side being exposed to the outside of the integrated circuit package;

a buffer pad made of a heat-conductive material having a nearly-equal CTE as the integrated circuit chip enclosed in the integrated circuit package, the buffer pad having a first side and a second side, with the first side being attached to the second side of the heat-conductive piece; and a flexible adhesive layer having a first side attached to the second side of the buffer pad and a second side attached to the integrated circuit chip;

performing a molding process to form an encapsulant which encapsulates the entire integrated circuit chip and the heat-dissipating structure, with one side of the heat-conductive piece being exposed to the outside of the encapsulant; and providing external electrical connecting means to the exposed side of the substrate.

7. The method of claim 6, wherein the integrated circuit chip is electrically connected to the substrate through wire bonding.

8. The method of claim 6, wherein the integrated circuit chip is electrically connected to the substrate through flip-chip bonding.

9. The method of claim 6, wherein the buffer pad is made of a material selected from the group consisting of ceramics, dielectrics and semiconductor material.

10. The method of claim 6, wherein the buffer pad is a non-functioning integrated circuit chip.

11. The method of claim 6, wherein the heat-dissipating structure further comprises a second flexible adhesive layer between the heat-conductive piece and the buffer pad.

* * * * *